United States Patent [19]
Luftman et al.

[11] Patent Number: 5,478,776
[45] Date of Patent: Dec. 26, 1995

[54] PROCESS FOR FABRICATING INTEGRATED CIRCUIT CONTAINING SHALLOW JUNCTION USING DOPANT SOURCE CONTAINING ORGANIC POLYMER OR AMMONIUM SILICATE

[75] Inventors: Henry S. Luftman, Emmaus, Pa.; Roderick K. Watts, Summit, N.J.

[73] Assignee: AT&T Corp., Murray Hill, N.J.

[21] Appl. No.: 174,595

[22] Filed: Dec. 27, 1993

[51] Int. Cl.$^6$ .................................................. H01L 21/225
[52] U.S. Cl. ........................ 437/163; 437/160; 437/950
[58] Field of Search .................................. 437/160, 163, 437/950, 228; 148/DIG. 144, DIG. 37; 216/83, 72

[56] References Cited

U.S. PATENT DOCUMENTS

| | | | |
|---|---|---|---|
| 3,532,563 | 10/1970 | Genser | 437/163 |
| 3,914,138 | 10/1975 | Rai-Choudhury | 437/163 |
| 3,915,766 | 10/1975 | Pollack et al. | 437/163 |
| 4,251,285 | 2/1981 | Yoldas et al. | 437/163 |
| 4,565,588 | 1/1986 | Seki et al. | 148/188 |
| 4,571,366 | 2/1986 | Thomas et al. | 437/163 |
| 4,927,773 | 5/1990 | Jack et al. | 437/163 |
| 5,183,777 | 2/1993 | Doki et al. | 437/160 |

FOREIGN PATENT DOCUMENTS

| | | | |
|---|---|---|---|
| 84-089981 | 9/1982 | European Pat. Off. | 437/163 |
| 86669A | 10/1978 | Japan | 437/163 |
| 57-73931 | 5/1982 | Japan | 437/163 |
| 58-176926 | 10/1983 | Japan | 437/163 |
| 3163821 | 7/1991 | Japan | 437/163 |

OTHER PUBLICATIONS

Wolf, Silicon processing for the VLSI Era vol. 1, Processing Technology, p. 518, copyright 1986.
S. N. Hong, "Characterization of Ultra-Shallow p+-n Junction Diodes Fabricated by 500-eV Boron-Ion Implantation", *IEEE Transactions on Electron Devices*, 38(1), (Jan. 1991) pp. 28–31.
E. Ling, et al., "Very Shallow Low-Resistivity p+-n Junctions for CMOS Technology", *IEEE Electron Device Letters*, 8(3), pp. (1987) pp. 96–97.
M. Ando et al., "Si solar cells fabricated by Incoherent Light-Induced Diffusion of Phosphorus from a Spin-on Source", *Technical Digest of the International PVSEC-1 1*, (Nov. 1984) pp. 67–70.
B. Hartiti, "Phosphorus Diffusion into Silicon from a Spin-on Source Using Rapid Thermal Processing,"0 *Journal of Applied Physics*, 71(11), (Jun. 1992) pp. 5474–5478.
"Toshiba Builds World's Smallest MOS Transistor," *Semiconductor International*, (Nov. 1993) p. 20.
A. Usami et al., "Shallow junction formation for silicon solar cells by Light-Induced Diffusion of Phosphorus from a Spin-on Source," *Conference Record of the Eighteenth IEEE Photovoltaic Specialists Conference*, (1985) pp. 797–803.
J. Kato et al., "Phosphorus Diffusion Using Spin-On Phosphosilicate-Glass Source and Halogen Lamps," *Journal of the Electrochemical Society*, vol. 132, No. 7, (Jul. 1985) pp. 1730–1732.

*Primary Examiner*—Olik Chaudhuri
*Assistant Examiner*—S. Mulpuri
*Attorney, Agent, or Firm*—Richard J. Botos

[57] ABSTRACT

The invention is directed to a process for fabricating a device with a junction thereon with a depth of 0.06 microns or less. The substrate also has a silicon dioxide material thereon. A dopant source is applied over a junction on the substrate. The substrate is then rapid thermal annealed to drive the dopant source into the substrate. The dopant source is then removed from the substrate using an etchant that does not contain a significant amount of HF.

9 Claims, 2 Drawing Sheets

PROCESS FOR FABRICATING INTEGRATED CIRCUIT CONTAINING SHALLOW JUNCTION USING DOPANT SOURCE CONTAINING ORGANIC POLYMER OR AMMONIUM SILICATE

BACKGROUND OF THE INVENTION

1. Field of the Invention

The process of the present invention is directed to fabricating an integrated circuit with shallow junctions.

2. Art Background

Design rules for integrated circuits are becoming increasingly small. As integrated circuit dimensions decrease, so do the dimensions of the discrete devices in the integrated circuit. A p-n junction is a typical component of an integrated circuit device. A p-n junction is the internal boundary between a portion of a substrate, typically silicon, that is doped with an n-type material and another portion of a substrate that is doped with a p-type material. The amount of the dopant introduced into the substrate and the depth to which the dopant penetrates into the substrate determines the depth of the junction. As the dimensions of integrated circuits decrease, the junction depths of discrete devices also decrease.

A process for fabricating ultra-shallow junctions in integrated circuit devices are described in Hong, S. N., et al., "Characterization of Ultra-Shallow $p^+$–n Junction Diodes Fabricated by 500-eV Boron-Ion Implantation," *IEEE Transactions on Electron Devices*, 38(1), pp. 28–31 (January 1991). The article describes a low energy method for ion implantation of dopants, and states that the shallowest junction depths obtained by this technique are 0.06 to 0.08 microns. In the described method, boron is ion implanted into the substrate using low (500 eV) energy. This implantation introduces defects into the silicon substrate. The article states that this damage is relatively close to the surface, and these near-surface defects are removed by rapid thermal annealing.

To control junction depth, one must control the amount of dopant introduced into the substrate and the degree to which the dopant penetrates into the substrate. Although ion implantation is typically used to introduce dopants into silicon, it is difficult to control the degree to which the dopants penetrate the silicon using this procedure. As recognized in Ling, E., et al., "Very Shallow Low-Resistivity $p^+$–n Junctions for CMOS Technology," *IEEE Electron Device Letters*, 8(3), pp. 96–97 (1987), ion implantation of dopants such as boron can also cause defects in the substrate. Ling et al. report that junction depths of 0.1 μm or more are obtained if a spin-on dopant source is applied onto a substrate and the substrate is then subjected to rapid thermal annealing to drive the dopant into the substrate.

Spin-on dopant sources are an alternate means to ion implantation for introducing dopants into silicon. Spin-on dopant sources are described in Usami, A., et al. "Shallow Junction Formation for Silicon Solar Cells by Light-induced Diffusion of Phosphorus from a Spin-on Source," *Conference Record of the Eighteenth IEEE Photovoltaic Specialists Conference*, pp. 797–803 (October 1985), and Ando, M., et al., "Si solar cells fabricated by Incoherent Light-Induced Diffusion of Phosphorus from a Spin-on Source," *Technical Digest of the International PVSEC*-1, pp. 67–70 (November 1984). Dopant is introduced into the silicon from the spin-on dopant source by diffusion from the spin on dopant source into the silicon. These dopant sources are termed "spin-on" because they are spun on the substrate as a film.

Usami et al. describe a process in which a Phosphorus (P)-doped oxide film is spun onto a substrate. The substrate is then subjected to a rapid thermal diffusion process to drive the dopant into the substrate. Usami et al. report that a stress field is induced by the difference of thermal expansion coefficient between oxide films and silicon. Ando et al. also describe a process in which a P-doped oxide film is spun onto a substrate. Ando et al. report that junction depths in excess of 0.1 μm were obtained by subjecting substrates on which a spin-on dopant source was applied to incoherent light annealing.

The doping of junctions with a depth of 0.02 microns is disclosed in Hartiti, B., "Phosphorus Diffusion into Silicon from a Spin-on Source Using Rapid Thermal Processing," *Journal of Applied Physics*, 71(11), pp. 5474–5478 (June 1992). The reference describes spinning a 2000 Å thick phosphorus-doped silicon film (a spin on dopant source) on a substrate. The substrate has a layer of silicon dioxide over certain discrete areas of the surface. The oxide prevents the dopant from permeating into the portion of the substrate underlying the oxide. This oxide is referred to as the field oxide and, because of its insulating properties, it plays an important role in device performance as well as device fabrication. Haiti et al. describes subjecting the substrate to rapid isothermal processing at 800° C. to 1000° C. for between 5 and 120 seconds under a pure argon flow to drive the dopant into the substrate. Haiti et al. report that the film was removed by a 5 minute hydrofluoric acid (HF) cleaning.

HF dissolves silicon dioxide. Therefore, it is likely that a portion of the field oxide adjacent to the film will also be dissolved if an HF etchant is used to remove the film of spin-on dopant source from the substrate. In devices with shallow junctions, the field oxide is commensurately thin. Consequently, any etching of the field oxide significantly reduces the amount of field oxide left on the device. Because of the importance of the oxide in device performance, a process for fabricating a device with shallow junctions under conditions that do not remove a significant amount of the field oxide is therefore desired.

SUMMARY OF THE INVENTION

The present invention is directed to a process for fabricating an integrated circuit with shallow junctions. The shallow junctions typically have a depth of about 0.06 microns or less. These shallow junctions are suitable for devices fabricated according to design rules as small as 0.1 micron.

In the process of the present invention, a dopant is introduced into the surface of a substrate. Typically, there is some sort of diffusion barrier over a portion of the substrate so that the dopant will only diffuse into those discrete areas of the substrate that are desired to be doped. The dopant is introduced into the substrate via a dopant source which is applied as a film over the silicon.

The process is illustrated schematically in FIGS. 1A–1D. The dopant source 20 is applied onto a suitable substrate 10, an example of which is depicted in FIG. 1A. Suitable substrates include p-type or n-type silicon wafers. If the substrate is silicon, silicon dioxide (oxide herein), is typically the barrier material grown or deposited on the substrate that prevents the dopant from diffusing into the portions of the substrate underlying the silicon substrate. The field oxide 60 and the oxide-coated polysilicon gate 70 are placed over certain areas of the silicon wafer 10. The polysilicon gate 70 is also oxide-coated 65 to prevent the dopant from diffusing into the gate and the portion of the substrate underlying the gate.

The dopant source is a doped film 20 as depicted in FIG. 1B that is applied onto the substrate by spinning or some other suitable technique such as spraying. These techniques for applying dopant-source films are known to those skilled in the art. Suitable materials for these dopant-source films include, for example, doped organic polymers and doped ammonium silicates. The form and amount of the dopant source varies depending upon the amount of the dopant desired to be introduced into the device and whether the silicon is desired to be n-type or p-type. Examples of suitable n-type dopants are phosphorus, arsenic, and antimony. Boron is an example of a suitable p-type dopant. The amount of dopant in the dopant source is about 1 to about 10 mole percent. It is contemplated that any conventional dopant will be introduced into silicon by the process of the present invention.

After the dopant source is applied onto the device, the device is subjected to rapid thermal annealing to drive the dopant into the junction as depicted in FIG. 1B. The device is heated to a peak temperature of about 900° C. to about 1100° C. for about 10 to about 30 seconds in an atmosphere that is essentially oxygen-free. It is advantageous if the substrate is rapid thermal annealed in an inert atmosphere. The rapid thermal anneal drives dopant into the junction at a peak doping concentration of at least about $1\times10^{19}$ atoms/cc. The concentration of the dopant at the junction depth is about $1\times10^{17}$ atoms/cc. The depth to which the device is doped to this degree or greater does not exceed about 600 Å (0.06 microns).

The dopant source is then removed from the substrate. It is an object of this invention that the dopant source be removed from the substrate without removing a significant portion of the oxide, 60 and 65, on the surface of the substrate. Therefore, the dopant source is removed by a solution that does not dissolve silicon dioxide to a significant degree during the time it takes to remove the dopant source from the substrate. The process of the present invention therefore provides the advantages of producing shallow junctions for devices fabricated to satisfy design rules as fine as 0.1 µm and not removing a significant portion of the oxide, 60 and 65, from the surface of the substrate when the dopant source is removed from the surface of the substrate.

Silicon dioxide is dissolved by HF and etchants that contain HF. Therefore, a suitable dopant source is one that, after rapid thermal annealing, is removed from the substrate by an etchant that does not contain a significant amount of HF.

Suitable dopant sources do not contain a significant amount of oxide, because the presence of oxide will cause silicon dioxide to form when the substrate is rapid thermal annealed to drive the dopant from the spin-on dopant source into the substrate. If a significant amount of silicon dioxide is formed during the rapid thermal annealing process, it will have to be removed from the substrate when the spin-on dopant source is removed from the substrate. This will require the use of an etchant that dissolves silicon dioxide. As stated previously, the field oxide 60 and gate oxide 65 on the substrate are also dissolved when such etchants are used to remove the spent spin-on dopant source. Therefore, to achieve the object of the present invention, the spin-on dopant source used in this process does not contain a significant amount of oxide.

A dopant source that is dissolved by an aqueous solution of a strong oxidizing agent, e.g., hydrogen peroxide or water, and a strong base, e.g., ammonium hydroxide is advantageous in the process of the present invention. Such a dopant source does not transform into an oxide when subjected to the rapid thermal annealing conditions described above. As depicted in FIG. 1C, after the dopant source is removed, a device with a suitably doped junction 15 is obtained.

DETAILED DESCRIPTION

Figure 1A:
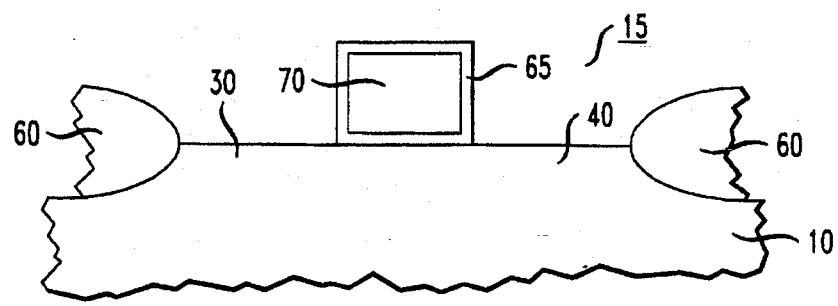
FIG. 1 is a schematic of the process of the present invention.

Referring to FIG. 1, a junction 15 of a device is depicted. The device is a MOSFET (Metal Oxide Semiconductor Field Effect Transistor). The process of the present invention is suitable for fabricating (for purposes of illustration and not limitation) devices such as n-MOS devices, p-MOS devices, CMOS devices, and biCMOS devices. The source 30 and drain 40 areas of a typical MOSFET are depicted in FIG. 1A. A dopant source 20 is applied over the source 30 and drain 40 areas as depicted in FIG. 1B. The dopant source is either a doped organic polymer or a doped ammonium silicate. These dopant sources are known to those skilled in the art.

It is contemplated that, if only one of either the source 30 or drain 40 areas of the device are desired to be doped, a mask of a suitable material will be deposited over the area into which dopant is not desired to be introduced. Techniques for placing a mask over and removing a mask from a discrete area on a substrate are known to one skilled in the art.

Dopant sources that are contemplated as useful in the process of the present invention include organic silicates such as $((CH_3)_2SiO)_n$. Although typically referred to as spin-on dopant sources, one skilled in the art will appreciate that these dopant sources are applied onto substrates by spinning as well as by other techniques. Organic silicate spin-on dopant sources are commercially obtained. One example of such an organic silicate spin-on dopant source is Borosilica Film from the Emulsitone Co. in Whippany, N.J. Another example of a suitable spin on dopant source is an ammonium silicate with the general formula $(NH_4)_2SiO_3$. One skilled in the art will appreciate that these materials are obtained commercially from a number of different sources.

An organic resin spin-on dopant source is also useful in the process of the present invention. These resins are also well known to those skilled in the art. These resins are typically alkanes with a plurality of carbonyl functional groups. Examples of these resins include $(C_{15}H_{30}O_3)_n$ and $(C_{10}H_{16}O_3)_n$. The latter is commercially available as Borofilm 100 from the Emulsitone Co., Whippany, N.J.

As stated previously, substrates used in the process of the present invention will typically have areas of oxide 60 thereon. It is advantageous if these areas of oxide remain on the substrate during subsequent processing. However, the spin-on dopant source is removed from the substrate after the dopant has been driven from the dopant source into the substrate. It is an object of the present invention for the spin-on dopant source to be removed from the substrate under conditions that do not remove a significant portion of the oxide, 60 or 65, from the substrate. In order to accomplish this objective, the spin-on dopant source does not contain a significant amount of oxide. Therefore, when the spin-on dopant source is rapid thermal annealed to drive the dopant into the substrate, significant amount of oxides are not formed. Since significant amounts of oxide are not formed during rapid thermal annealing, the dopant source is subsequently removed from the substrate using an etchant that does not remove a significant amount of the oxide 60 and 65 from the substrate.

The spin-on dopant source contains a dopant that is either n-type or p-type. Suitable dopants are known to those skilled in the art. Examples of suitable n-type dopants include phosphorus, arsenic, and antimony. Boron is an example of a suitable p-type dopant. One skilled in the art will appreciate that the dopants are incorporated in the dopant sources in a variety of formulations. For example, boron is introduced into the dopant source as $B_2O_3$ or $C_6H_5B(OH)_2$. Phosphorus is introduced into the dopant source as $C_6H_5P(OH)_2$.

The dopant sources are typically applied to the substrate in liquid form. Typically, films with a thickness of about 2000 Å to 3000 Å are spun onto the substrate. The films are baked at an elevated temperature at about 100° C. to 300° C. in air to remove the solvent from the film.

Figure 1B:
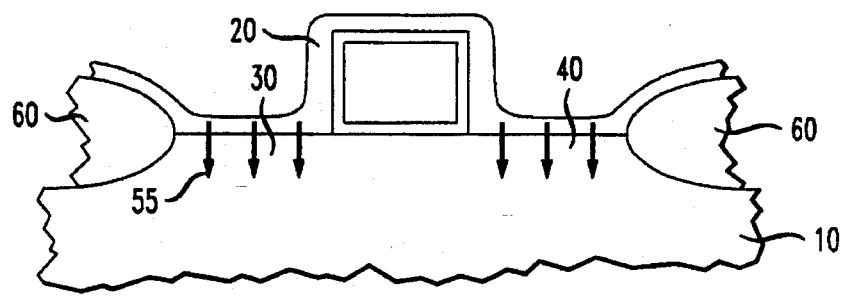

The films are then subjected to a thermal driving force to drive the dopant into the substrate. This step is illustrated in FIG. 1B, wherein the arrows indicate the dopant 55 penetrating into the device. It is advantageous if the substrate is rapid thermal annealed to drive the dopant into the substrate. The substrate is heated to a peak temperature at a rate of about 5° C./second to about 20° C./second and maintained at that peak temperature for less than 1 minute. It is advantageous if the substrate is heated at a rate of about 10° C./second. The peak temperature is about 900° C. to about 1100° C. It is advantageous if the device is maintained at the peak temperature for about 10 to about 30 seconds. The device is then cooled at a rate of about 10° C. per second to about 200° C. per second. It is advantageous if the substrate is cooled at a rate of about 150° C. per second.

It is advantageous if the device is rapid thermal annealed in an atmosphere that is essentially free of oxygen. An atmosphere is "essentially free" of oxygen although it contains a small amount of oxygen as an impurity. It is advantageous if the atmosphere contains less than 1 volume percent of oxygen. Atmospheres of argon, helium, nitrogen, or neon are contemplated to be suitable.

Figure 1C:
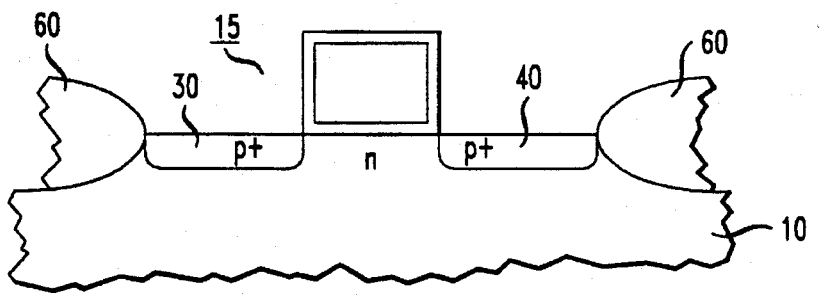

As illustrated in FIG. 1C, the spin-on dopant source is removed from the device 10. The dopant source is removed by a solution etch. The solution etch does not remove a significant amount of the oxide, 60 or 65, on the substrate surface, however. Therefore, it is contemplated that the etchant is essentially free of HF.

It is advantageous if the etchant is an aqueous solution containing a strong base, e.g., a base with a $pk_b$ of 6 or less, and an oxidizing agent such as a peroxide. An example of a suitable solution is one that is about 40 to about 80 volume percent water, about 10 to about 30 volume percent hydrogen peroxide, and about 5 to about 15 volume percent ammonium hydroxide. It is advantageous if the etchant is heated to about 80° C. to about 85° C.

The etchant does not contain a significant amount of hydrofluoric acid (HF). It is contemplated that some amount of HF might be present as an impurity. Such a small amount of HF, i.e., less than 0.1 percent by volume, is not considered significant in the context of the present invention. In fact, only those dopant sources that are removed from the substrate using an etchant that is substantially free of HF are suited for use in the present process. Since the above described dopant sources do not appreciably convert to silicon dioxide during rapid thermal annealing in an inert atmosphere, an etchant, such as HF, that removes silica is not required to remove these dopant sources from the substrate.

Figure 1D:
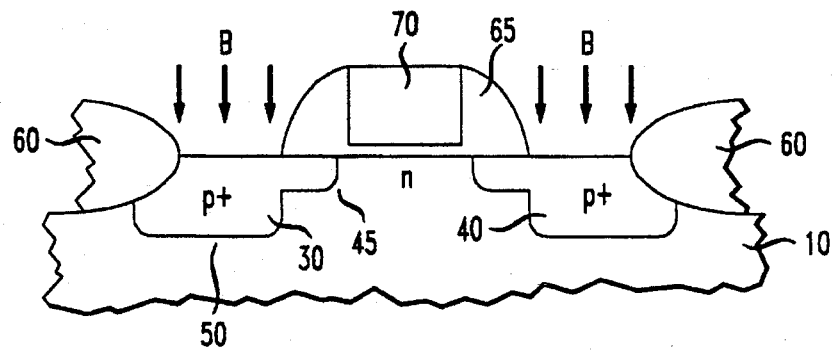

After the spent spin-on dopant source is removed from the substrate 10, the substrate is doped a second time as illustrated in FIG. 1D. This second doping step is performed to deepen the junction in the area away from the transistor. Accordingly, prior to the second step, the gate oxide 65 is expanded to cover more area so that the junction in the near-transistor area is not deepened. The deeper portion of the junction reduces the sheet resistance of the open source and drain areas, 30 and 40.

Figure 2:
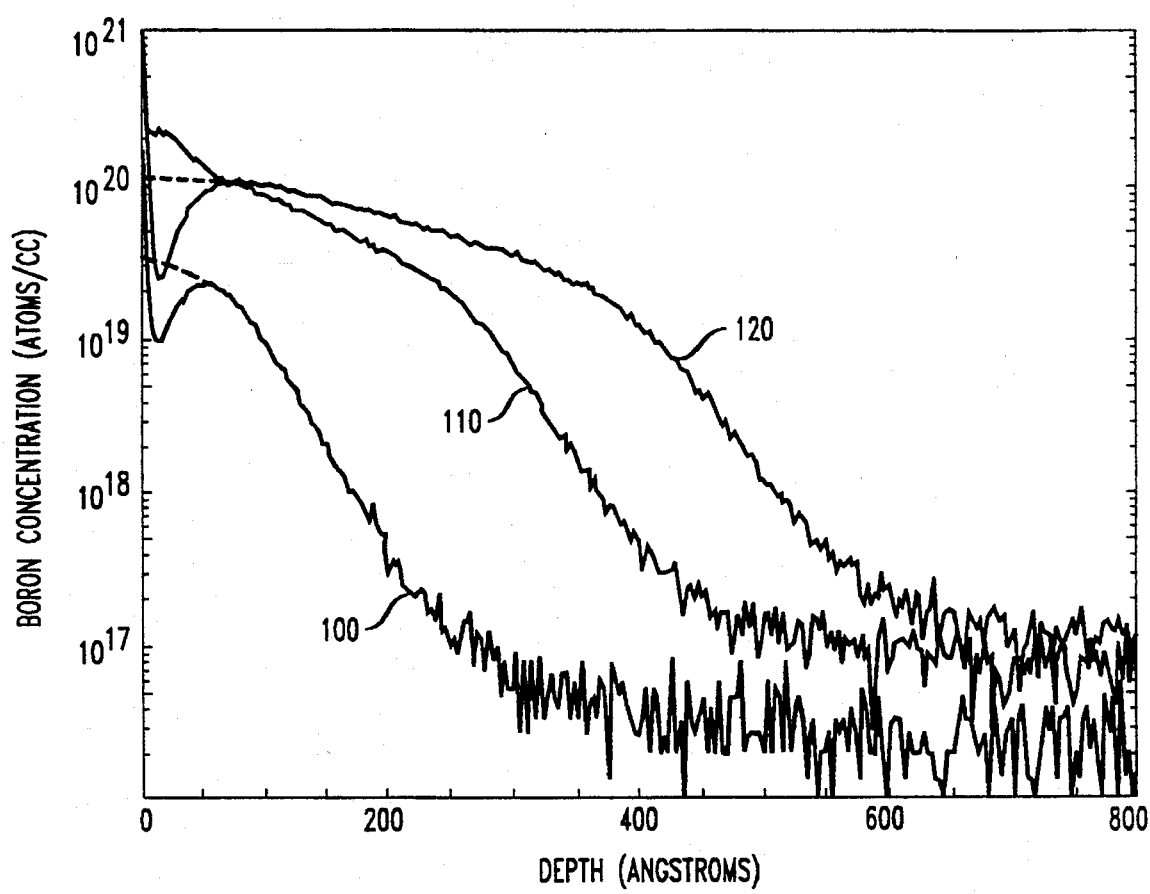
FIG. 2 illustrates different dopant profiles provided by the process of the present invention.

The devices fabricated by the process of the present invention have shallow junctions. In order to provide shallow junctions, the doping profile must be commensurately shallow. Doping profiles provided by the process of the present invention are illustrated in FIG. 2. The dopant profiles depicted in FIG. 2 represent the concentration of boron in the substrate as a function of distance from the substrate surface. FIG. 2 illustrates the effect of the temperature to which the substrate was heated as it was rapid thermal annealed on the doping profile. Other factors such as the spin-on dopant source used and the concentration of dopant in the spin-on dopant source will also affect the doping profile, but these effects are not illustrated by FIG. 2 because the same dopant source was used to obtain all three profiles. These factors and their effects on the resultant doping profile are well known to those skilled in the art.

As illustrated by FIG. 2, the dopant concentration is greatest at the surface of the substrate. The dopant concentration decreases as the distance from the substrate surface increases. The depth of the junction is the distance into the substrate from the substrate surface in which the dopant concentration is at least $1 \times 10^{17}$ $cm^{-3}$. For example, the junction depths for the doping profiles depicted in FIG. 2 are 250 Å for the first profile 100, 470 Å for the second profile 110, and 600 Å for the third profile 120. Consequently, the junctions with the profiles illustrated in FIG. 2 have a depth of 0.6 microns or less.

The first profile was achieved by annealing at 961° C. for 15 seconds for a total dopant concentration of $1.9 \times 10^{13}$ atoms/$cm^2$, which is the total dopant concentration through the junction depth. The second profile was achieved by annealing at 1032° C. for 15 seconds for a total dopant concentration of $2.1 \times 10^{14}$ atoms/$cm^2$. The third profile was achieved by rapid thermal annealing at 1088° C. for 15 seconds for a total dopant concentration of $2.3 \times 10^{14}$ atoms/$cm^2$.

The examples below are provided to illustrate the claimed invention. The examples are not to be construed as limiting the invention defined by the claims.

EXAMPLE 1

A spin-on glass, Borosilica Film obtained from the Emulsitone Co. of Whippany, N.J. was spun onto the source-drain area of a p-type metal oxide on silicon (p-MOS) transistor at a speed of 1500 rpm. The film was doped with boron as $B_2O_3$. The film was baked at 200° C. A film thickness of 2500 Å was obtained.

The substrate with the spin-on dopant source was then subjected to rapid thermal annealing. The device was heated to 1000° and held at that temperature for 15 seconds. The device was then cooled to room temperature at a rate of about 150° C. per second.

The spin-on dopant source was then removed by immersing the device in an etchant that was about 73 volume percent water, about 18 volume percent hydrogen peroxide and about 9 volume percent ammonium hydroxide. The etchant was heated to a temperature of about 85° C. The device was etched for about 50 minutes.

EXAMPLE 2

An organic resin, Borofilm 100 obtained from the Emulsitone Co. of Whippany, N.J. was spun onto a substrate with a source/drain area of a p-MOSFET thereon at a speed of 1500 rpm. The film was baked at 200° C. A film thickness of 2600 Å was obtained. The film was doped with boron.

The substrate with the dopant source thereon was then subjected to rapid thermal annealing. The device was heated to 961° C. and held at that temperature for 15 seconds. The device was then cooled at a rate of about 150° C. per second.

The dopant source was then removed by immersing the substrate in an etchant that was about 73 volume percent water, about 18 volume percent hydrogen peroxide and about 9 volume percent ammonium hydroxide. The etchant was heated to a temperature of about 85° C. The device was immersed in the etchant for about 52 minutes. The doping profile that resulted is illustrated as 110 in FIG. 2.

We claim:

1. A process for fabricating a transistor with a junctions depth of about 0.06 microns or less comprising:

depositing a dopant source comprising a dopant and a material selected from the group consisting of organic polymers and ammonium silicate onto at least a portion of a substrate;

wherein the concentration of dopant in the dopant source is about 1 mole percent to 10 mole percent heating the substrate to a temperature of about 900° C. to about 1100° C. in an atmosphere that is essentially oxygen free for a period not to exceed about 1 minute, thereby driving the dopant from the dopant source into the substrate and providing shallow junctions for source and drain areas with a peak dopant concentration in excess of $1\times10^{19}$ atoms/cm$^3$ and a depth that does not exceed about 0.06 microns into the substrate; and removing the dopant source from the substrate using an etchant comprising an oxidizing agent and a strong base that is essentially free of HF.

2. The process of claim 1 wherein the essentially oxygen free atmosphere is an inert gas atmosphere.

3. The process of claim 2 wherein the inert atmosphere is argon.

4. The process of claim 1 wherein the dopant is selected from the group consisting of boron and phosphorus.

5. The process of claim 1 wherein the material in the dopant source contains a sufficiently small amount of oxide so that the dopant source is removed from the substrate using an etchant comprising an oxidizing agent and a strong base that is essentially free of HF.

6. The process of claim 1 wherein the etchant is an aqueous solution of a peroxide and a strong base with a p$k_b$ of 6 or less.

7. The process of claim 6 wherein the etchant is ammonium hydroxide.

8. The process of claim 6 wherein the etchant is hydrogen peroxide.

9. The process of claim 1 wherein the substrate is a silicon substrate.

\* \* \* \* \*